United States Patent
Kaji et al.

(10) Patent No.: US 6,930,306 B2
(45) Date of Patent: Aug. 16, 2005

(54) ELECTRON MICROSCOPE

(75) Inventors: Kazutoshi Kaji, Hitachi (JP); Yoshifumi Taniguchi, Hitachinaka (JP); Shigeto Isakozawa, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 10/807,116

(22) Filed: Mar. 24, 2004

(65) Prior Publication Data

US 2004/0188613 A1 Sep. 30, 2004

(30) Foreign Application Priority Data

Mar. 24, 2003 (JP) ..................... 2003-080429

(51) Int. Cl.⁷ ............... H01J 49/44; H01J 37/26
(52) U.S. Cl. ............ 250/305; 250/311; 250/306; 250/396 R; 250/397
(58) Field of Search ................ 250/311, 305, 250/306, 396 R, 397

(56) References Cited

U.S. PATENT DOCUMENTS

| | | | | |
|---|---|---|---|---|
| 4,743,756 A | * | 5/1988 | Krivanek | 250/305 |
| 5,798,524 A | * | 8/1998 | Kundmann et al. | 250/305 |
| 6,184,524 B1 | * | 2/2001 | Brink et al. | 250/305 |
| 6,703,613 B2 | * | 3/2004 | Kaji et al. | 250/305 |
| 6,794,648 B2 | * | 9/2004 | Kaji et al. | 250/311 |
| 2004/0000641 A1 | * | 1/2004 | Taniguchi et al. | 250/311 |

FOREIGN PATENT DOCUMENTS

| | | |
|---|---|---|
| JP | 52-27349 | 3/1977 |
| JP | 11-224639 | 8/1999 |
| JP | 2001-93459 A | 4/2001 |
| JP | 2001-307672 A | 11/2001 |
| JP | 2002-157973 A | 5/2002 |
| JP | 2003-151478 A | 5/2003 |
| WO | WO00/41206 | 7/2000 |

* cited by examiner

*Primary Examiner*—Nikita Wells
(74) *Attorney, Agent, or Firm*—McDermott Will & Emery LLP

(57) ABSTRACT

A scanning transmission electron microscope has an electron beam energy analyzer (energy filter) to observe electron beam energy loss spectra and element distribution images. This electron microscope further includes a deflection coil provided on the upstream side of a magnetic sector to correct for the electron beam path in a plane normal to the optical axis and make the electron beam incident to the energy filter, a deflection coil for correcting for the electron beam path in the energy axis direction of an energy dispersion surface formed by the magnetic sector, and a control unit for controlling the exciting conditions of the deflection coils.

10 Claims, 6 Drawing Sheets

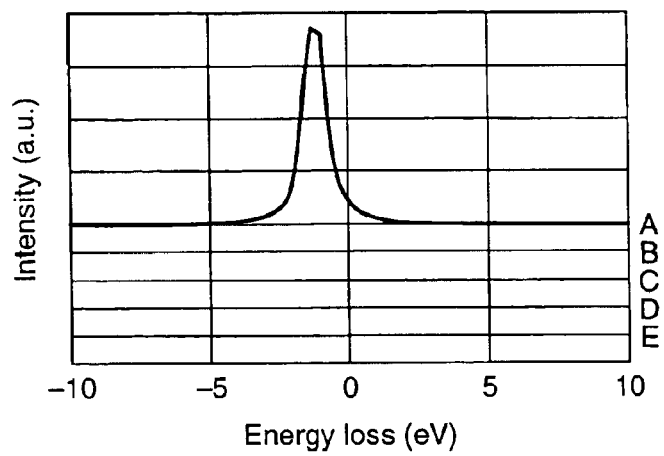
FIG. 4A
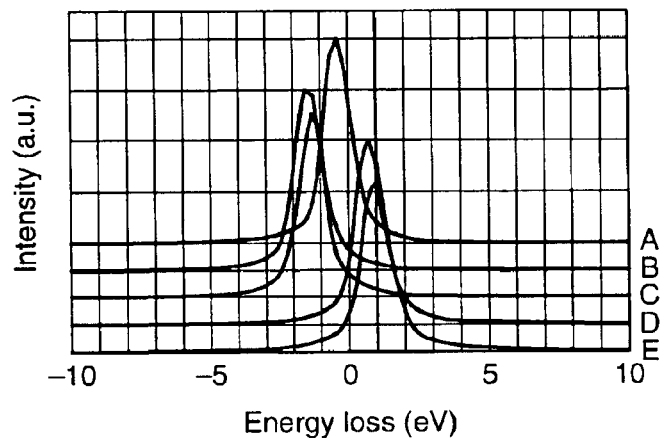
FIG. 4B
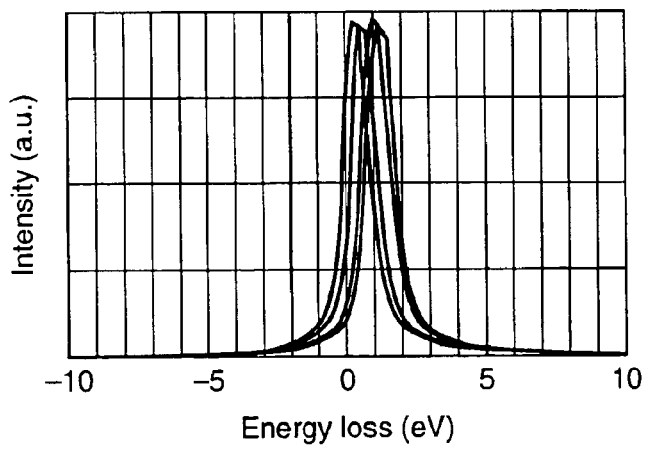
FIG. 4C
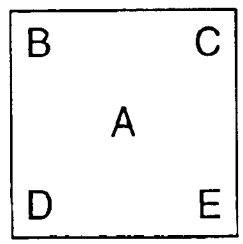
FIG. 4D  POSITIONS OF ELECTRON BEAM

ELECTRON MICROSCOPE

BACKGROUND OF THE INVENTION

The present invention relates to an electron microscope having an electron energy loss spectrometer (EELS) called energy filter.

The semiconductor devices and magnetic heads have been miniaturized or small-sized up to laminated thin film structures of a few nanometers (nm) formed on a submicron region. In the device development, it is important to analyze the structures, elementary distributions, crystal structures and chemical bond states of very small regions, and it is also necessary to observe those very small regions at a small magnification so that the whole device structure can be scrutinized at a time.

A Japanese patent document JP-A-2001-93459 (paragraph 0034–0037, FIG. 1) describes a conventional scanning transmission electron. Microscope (STEM) having the energy filter. The conventional electron microscope is described with reference to the conceptual structure diagram of FIG. 6. The electron beam to be irradiated on a sample 5 is deflected by an electron beam-scanning coil 3. For large magnification observation, the electron beam passes along the optical axis of the electron microscope or passes along its vicinity to strike the sample. For small-magnification the electron beam passes not only along the optical axis of the electron microscope or its vicinity but also along paths out of the optical axis. The path of the electron beam passing through a projection lens 7 is corrected by a two-stage deflection coil 8 that is provided on the upstream side of a magnetic sector 9.

In the prior art, when the scanning range of the electron beam at the sample 5 the magnification of an object lens 4, and the magnification of the projection lens 7 are 0.75 $\mu$m. 20 and 0.5 respectively, the amount of electron beam shift on the downstream side of the projection lens 7 is 7.5 $\mu$m without compensation for the path, and it can be reduced to as low as about 0.5 $\mu$m with compensation.

The electron beam having a path compensated by the deflection coil 8 is incident to the magnetic sector 9, where the energy of the electron beam is analyzed. The electron beam exiting from the magnetic sector 9 produces an electron beam energy loss spectrum on the energy dispersion surface of the magnetic sector 9. An electron beam detector 13 measures this electron beam energy loss spectrum. A magnification lens 15 magnifies the electron beam energy loss spectrum, making it possible to examine the shape or the like of the spectrum in details.

When the path of the electron beam is corrected by the prior art, the electron beam is shift by 75 $\mu$m at the position of electron beam detector 13. When the energy dispersion is 0.1 eV/25 $\mu$m, the amount of shift, 75 $\mu$m corresponds to 0.3 eV. However, when the electron beam scans the sample 5 up to a position of 13 $\mu$m away from the optical axis of the electron microscope, the electron beam is shifted by 1300 $\mu$m at the position of electron beam detector 13. When the energy dispersion is 0.1 eV/25 $\mu$m, this amount of shift corresponds to 5.2 eV.

The conventional STEM having the energy filter allows for the compensation for the path of the electron beam up to the incidence to the energy filter from passing through the sample so that the sample can be observed at small magnification. However, since it does not consider the path of the electron beam that exited from the energy filter, the amount of shift increases as described above. Particularly in the above-mentioned document, an electromagnetic lens for magnifying the spectrum is provided on the downstream side of the energy filter, thus eliciting the amount of shift of the energy.

SUMMARY OF THE INVENTION

It is an object of the invention to provide an electron microscope having an electron beam energy loss spectroscope provided to correct the path of the electron beam exiting from the magnetic sector so that the electron beam energy loss spectra and element distribution can be precisely observed even at small magnification, thus solving the problem in the prior art.

The invention for solving the above problem is characterized by the fact that the path of the electron beam is precisely corrected for in the energy axis direction of the electron beam energy loss spectrum formed on the energy dispersion surface of the electron beam dispersion device (such as an energy filter).

The electron microscope of this invention has an electron beam energy loss spectrometer that includes an electron beam dispersion device for analyzing the energy of the electron beam, electron beam directing means provided on the upstream side of the electron beam dispersion device to direct the electron beam incident to the electron beam dispersion device, and path correction means for correcting the path of the electron beam exiting from the electron beam dispersion device in the energy-axis direction of an energy dispersion surface formed by the electron beam dispersion device.

The electron beam directing means for directing the electron beam incident to the electron beam dispersion device is composed of at least one or more stages of deflection coil, and the means for correcting the path of the electron beam exiting from the energy-dispersing means is formed of at least one or more stages of deflection coil provided on the downstream side of the energy-dispersing means.

Or the means for correcting the path of the electron beam exiting from the energy-dispersing means is formed of a velocity regulator capable of accelerating or decelerating the velocity of the electron beam or an electron beam energy dispersion adjuster by which an field intensity necessary to correct for the path of the electron beam is superimposed upon a field intensity for the energy dispersion for analyzing the energy of the electron beam.

The deflection coil of at least one or more stages disposed on the upstream side of the energy dispersing means corrects the path of the electron beam in the direction of two perpendicular axes in a plane normal to the optical axis of the energy-dispersing means, or in two-dimensional way. In addition, at least one of the directions in which the deflection coil of at least one or more stages provided on the downstream side of the energy-dispersing means corrects the path of the electron beam is in a plane normal to the optical axes of the energy-dispersing means and coincides with the direction of the energy axis of an energy dispersion surface formed by the energy-dispersing means.

The present invention is an electron microscope that can measure the electron beam energy loss spectra and observe element distribution images by analyzing the electron beam energy on the electron beam energy spectroscope. Particularly, in order that a particular energy-range electron beam of the energy-dispersed electron beams can be selected for the spectra measurement and element distribution observation, this electron microscope has a deflection coil provided to correct the path of the electron beam exiting from the energy-dispersing means or a velocity regulator provided to accelerate or decelerate the electron beam. Alternatively, it has an energy intensity adjuster provided on the upstream side of an energy selection slit in order that a field intensity necessary for the electron beam path correction can be superimposed upon the field intensity of the energy-dispersing means for analyzing the energy of the electron beam.

Moreover, the present invention is a scanning transmission electron microscope having a control unit provided to control each of an electron beam scanning device that deflects the electron beam to scan the sample, electron beam path correction means provided on the upstream side of the energy-dispersing means and another electron beam path correction means provided on the downstream side of the energy-dispersing means in association with the posit on of the electron beam on the sample so that the electron beam energy loss spectra and element distribution images can be measured and observed for each position of the electron beam on the sample and that the results can be displayed on a display unit.

According to the invention, the electron beam energy loss spectrum of the electron beam, when the electron beam is irradiated on the sample surface at a position separated a maximum of 13 micrometers away from the optical axis of the electron microscope, has no more than 1 eV of energy deviation relative to that of the electron beam irradiated along the optical axis of the microscope.

Other objects, features and advantages of the invention will become apparent from the following description of the embodiments of the invention taken in conjunction with the accompanying drawings.

BRIEF DESCRIPTION OF THE DRAWINGS

FIGS. 4A–4D are diagrams showing electron beam energy loss spectra according to the prior art and this embodiment of the invention.

DETAILED DESCRIPTION OF THE INVENTION

Figure 1:
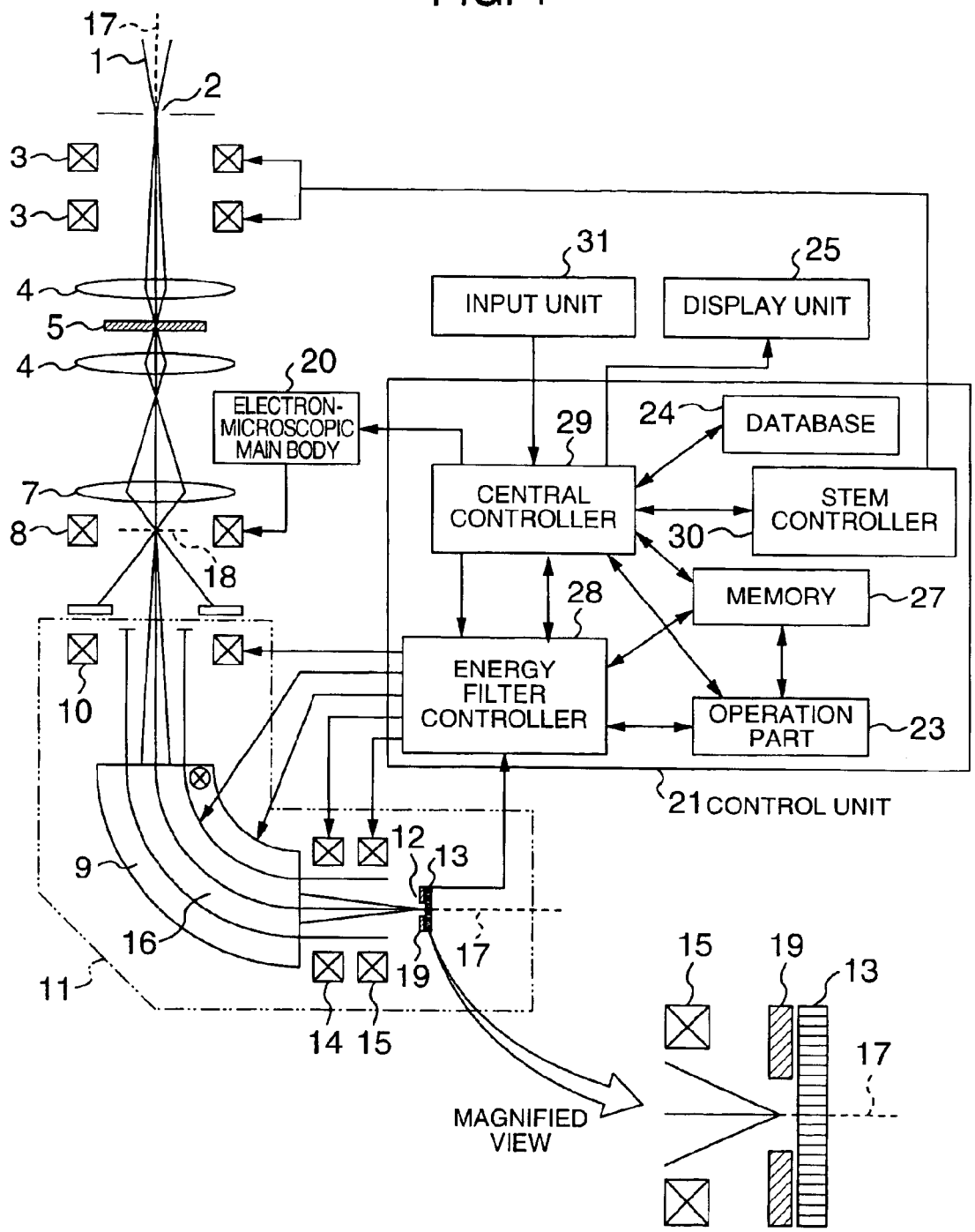
FIG. 1 is a schematic diagram of the construction of an electron microscope having an electron beam energy spectroscope according to one embodiment of the invention.

An embodiment of the invention will be described in detail with reference to the drawings. FIG. 1 is a schematic diagram of main portions of an embodiment of a scanning transmission electron microscope having an electron beam energy loss spectrometer (energy filter 11) according to the invention.

The electron beam 2 emitted from an electron beam generator 1 has a probe formed by the object lens 4 and irradiated on the sample 5. The electron beam to be irradiated on the sample 5 is deflected by the electron-scanning coil 3. For large magnification observation, the electron beam above the sample takes a path along the optical axis 17 of the electron microscope or the neighborhood of the optical axis to reach the sample. The crossover point of the project lens 7 corresponds to the front focal point of the magnetic sector 9 provided within the electron beam energy loss spectrometer 11. The electron beam that has passed through the sample 5 is incident to the magnetic sector 9, which analyzes the energy of the electron beam.

The electron beam that has exited from the magnetic sector 9 produces the electron energy loss spectrum on the energy dispersion surface of the magnetic sector 9. The electron beam detector 13 measures the electron energy loss spectrum. The magnification lens 15 magnifies the electron beam energy loss spectrum, thus enabling the operator to scrutinize the shape of the spectrum or others.

An energy selection slit 19 is sometimes provided on the upstream side of the electron beam detector 13 in order to select the energy of the electron beam incident to the electron beam detector 13.

The electron beam detector 13 is composed of, for example, 1024 channels. By detecting the intensity of the electron beam incident to each channel, it is possible to obtain the electron beam energy loss spectrum.

The electron beam detector 13 is not limited to the measurement of the electron beam energy loss spectrum. If the electron beam detector is composed of, for example, two channels or more, an element distribution image can be observed by simultaneously measuring electron beams of different energies incident to the respective channels, correcting for characteristics of the detector (for example, the sensitivity and dark current of the detector), and then computing by use of the electron beam intensities detected on the respective channels. For the computation method, 2-window or 3-window approach can be used to observe the element distribution image, as described in a document, "Electron Energy Loss Spectroscopy in the Electron Microscope" written by Egerton.

When the energy selection slit 19 is used, the electron beam detector 13 may be composed of, for example, one channel. In that case, the electron beam energy loss spectrum or energy filter image is observed by detecting the electron beam having the energy range of the electron beam passing through the opening of the energy selection slit 19.

A control unit 21 includes an STEM controller 30, an energy filter controller 28 and a central controller 29. The STEM controller 30 controls the electron beam to be positioned on the sample and to scan the sample. The energy filter controller 28 controls the electron-beam energy analysis conditions of the energy filter 11. For example, it controls the exciting condition of the magnetic sector 9 used in the energy filter 11, the focus condition or magnifying condition for the electron-beam energy loss spectrum, and the applied-voltage condition in a drift tube 16. The drift tube 16 is incorporated within the magnetic sector 9 and conducts the electron beam. The voltage applied to the drift tube 16 adjusts the speed of the electron beam and shifts on the electron beam detector 13 the Inner shell electron excited spectrum caused by exciting the inner shell electrons of the elements to be observed.

The central controller 29 has a database 24 that has and holds control parameters for magnetic sector 9 and focus lens 10 and the specific measurement conditions of elements to be measured, and a memory 27 that holds the measured spectrum and observed image. The central controller 29 also has an operation part 23 for computing the electron beam energy loss spectrum detected by the electron beam detector 13, and controls the STEM controller 30 and the energy filter controller 28. In addition, an input unit 31 on which the operator enters the element to be measured or others and a display unit 25 for displaying the electron beam energy loss spectrum and element distribution image are connected to the central controller 29.

The pre-deflection coil 8 and a post-deflection coil 14 are examples of the electron directing means and path correction means in this invention. The electron beam path correction controller in this invention is composed of the central controller 29 that transmits a control signal to an electron-microscopic main body 20 in order to control the pre-deflection coil 8, and the energy filter controller 28 that transmits a control signal to the post-deflection coil 14.

When the STEM of this embodiment is used to observe at small magnification, the electron beam above the sample passes not only along the optical axis 17 of the microscope or along its neighborhood but also along a path away from the optical axis 17.

Figure 2:
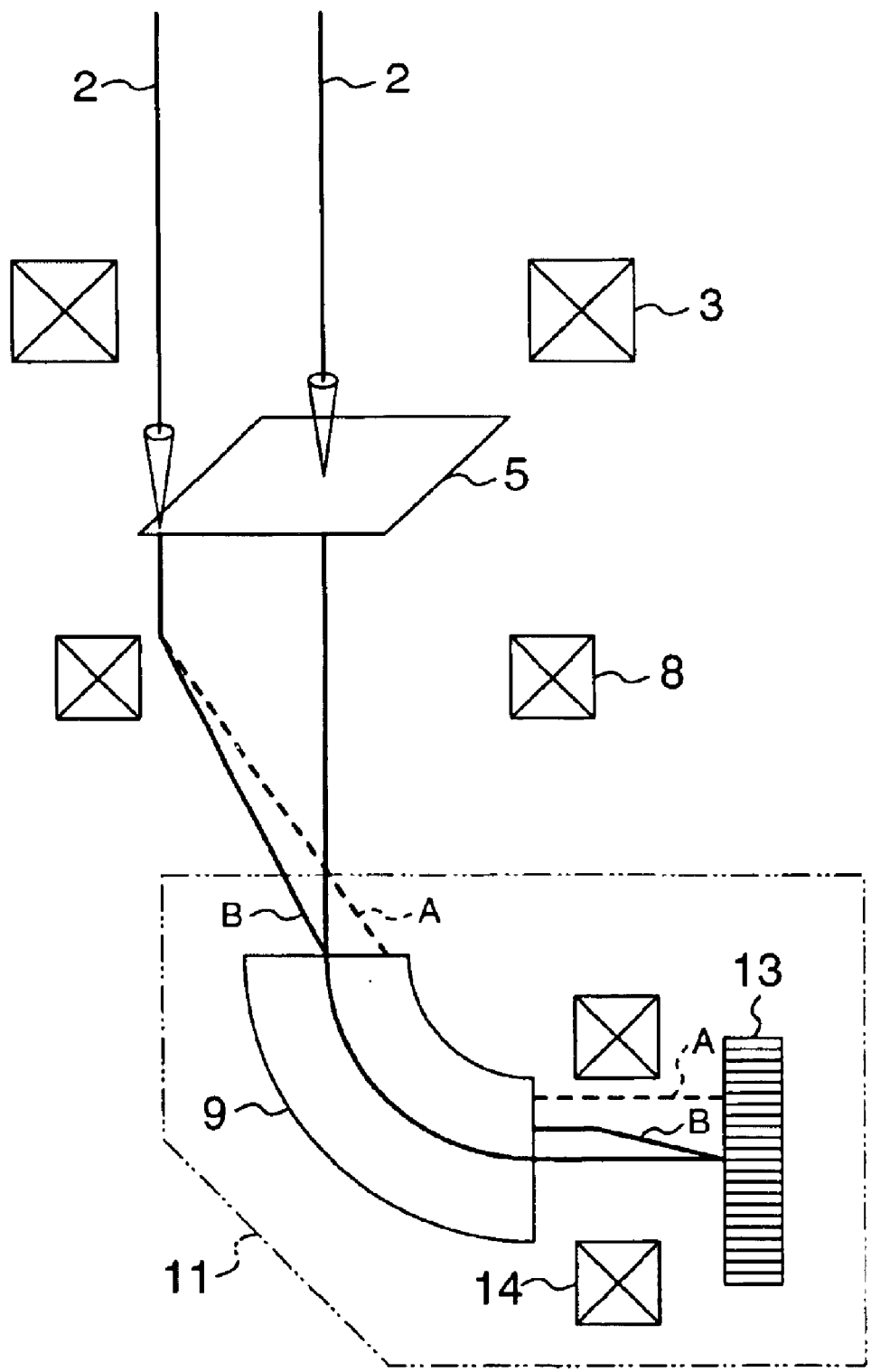
FIG. 2 is a schematic diagram showing the correction of the electron beam for the path.

FIG. 2 shows an outline of the electron beam path correction. In FIG. 2 the broken line indicates the uncompensated path of the electron beam (as denoted by A), and the solid line the compensated path of the electron beam (as represented by B). When the path is not compensated for, the electron beam that exits from the energy filter is, as indicated by the broken line, incident to a channel of electron beam detector 13 different from the channel to which the electron beam passing along the optical axis 17 is incident. The electron beam energy loss spectrum cannot be precisely measured under this condition.

However, the path of the electron beam passing through the projection lens 7 is compensated by the pre-deflection coil 8 placed on the upstream side of the magnetic sector 9 and the post-deflection coil 14 provided on the down-stream side thereof so that the path can be obtained as indicated by the solid line. Particularly, of the directions of paths in which the post-deflection coil 14 corrects for the path of the electron beam, one is the energy axis direction of the electron beam energy loss spectrum that the magnetic sector 9 produces. The electron beam with a corrected path is incident to the same channel of electron beam detector 13 as the channel to which the electron beam passing along the optical axis 17 is incident.

Thus, the electron beam energy loss spectrum can be correctly measured. The post-deflection coil 14 may be replaced by the drift tube 16 or magnetic sector 9. In that case, the central controller 29 orders the STEM controller 30 to control the position of the electron beam on the sample, and it commands to control the exciting conditions of the pre-deflection coil 8 and post-deflection coil 14 or the exciting condition of the pre-deflection coil 8 and the voltage-applying condition of the drift tube 16 or the exciting conditions of the pre-deflection coil 8 and magnetic sector 9 in association with the position of the electron beam on the sample.

The method of correcting the path of the electron beam will be described in detail. First, let it be mentioned how the front focal point 18 of magnetic sector 9 and the position of the electron beam in the energy dispersion surface of magnetic sector 9 are changed in accordance with the position of the electron beam on the sample.

Figure 3A:
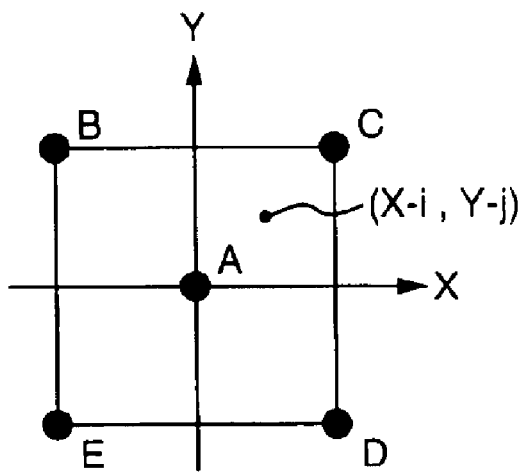
FIGS. 3A–3C are diagrams showing the relation among the electron beam positions.
Figure 3B:
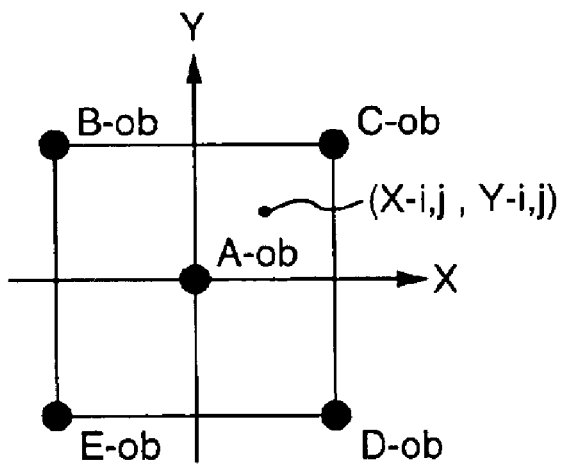
Figure 3C:
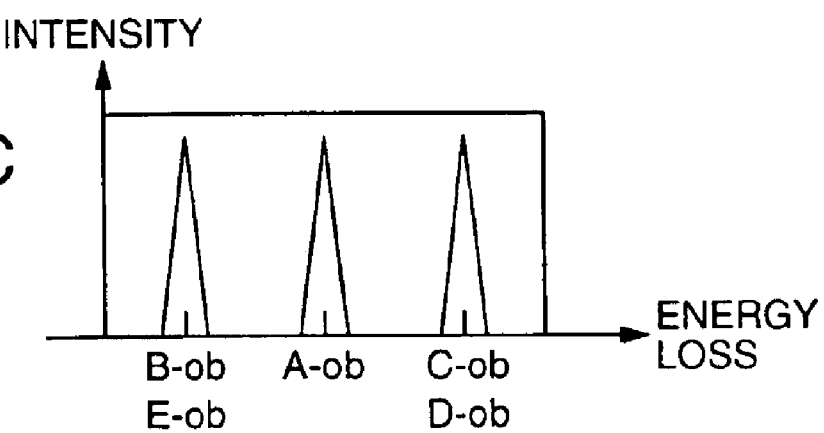

FIGS. 3A–3C are diagrams to which reference is made in explaining the relation of the electron beam positions. In FIG. 3A, it is assumed that on the sample surface the origin, and the coordinates (x, y) and (x__i, y__j) are the optical axis, the two perpendicular axes in a plane perpendicular to the optical axis and the position of the electron beam, respectively. The electron beam, after passing through the object lens 4 and projection lens 7, arrives at the front focal point 18 of magnetic sector 9, or at coordinates (X__i,j, Y__i,j) which can be expressed by Equation (1).

$$X\_i,j = a \times x\_i + b \times y\_j, \quad Y\_i,j = x \times x\_i + d \times y\_j \quad (1)$$

where the coordinates (X, Y) and coefficients a, b, c and d are respectively the two perpendicular axes in a plane perpendicular to the optical axis at the front focal point 18 of magnetic sector 9 as shown in FIG. 3B and constants peculiar to the microscope that are determined by the exciting conditions of the object ens 4 and projection lens 7.

The electron beam incident to the energy filter 11 is acted to disperse by the magnetic sector 9, thus producing a spectrum on the energy dispersion surface. At this time, the directions of the two axes (x, y) on the sample are determined so that the X direction of the front focal point 18 of magnetic sector 9 and the Y direction of the front focal point 18 can be respectively projected in the energy dispersion direction (represented by E) of the energy dispersion surface and in the electron beam intensity direction (denoted by I) perpendicular to the energy dispersion surface.

In addition, FIGS. 3A–3C show the position of the electron beam on the sample and the positional relation between the front focal point 18 and energy dispersion surface of magnetic sector 9. FIG. 3A shows the origin A of the optical axis and its peripheral points B, C, D and E on the sample surface. FIG. 3B is a diagram showing the projection of those points on the front focal point 18 of magnetic sector 9, where the points A~E are projected on the origin A-ob of the optical axis and its peripheral points B-ob~E-ob, respectively. Moreover, the origin A-ob of the optical axis and its peripheral points B-ob~E-ob are projected on the energy dispersion surface.

As shown in FIG. 3C, the points on the axis parallel to the Y-axis on the front focal point 18 of magnetic sector 9 are projected to shift by equal energy on the energy dispersion surface. The points B-ob, E-ob and the points C-ob, D-ob appear on the same energy positions. This relation can be expressed by Equation (2).

$$E\_i,j = p \times X\_i,j \quad (2)$$

where p is a constant that is determined by the energy dispersion (eV/µm) of energy filter 11 and the magnification.

Now, let it be described how the use of the pre-deflection coil 8 and post-deflection coil 14 compensates the path of the electron beam in association with the position of the electron beam on the sample.

The operation principle of the pre-defection coil 8 is basically to bring the electron beam position (X__i,j, Y__i,j) close to (0, 0) on the front focal point 18 of magnetic sector 9 as expressed by Equation (1). However, for small-magnification observation, it is necessary to give top priority to the condition for the incidence of the electron beam to the magnetic sector 9 of energy filter 11. In that case, the pre-deflection coil 8 is set so that the electron beam intensity is not decreased but the same as that along the optical axis. At this time, the electron beam position (Xc__i,j, Yc__i,j) on the front focal point 18 of magnetic sector 9 after the control is given by Equation (3).

$$Xc\_i,j = mp \times X\_i,j, \quad Yc\_i,j = np \times Y\_i,j \quad (3)$$

where 0 ≦ mp, and np < 1.

The pre-deflect on coil 8 deflects the electron beam in the directions of two perpendicular axes in a plane perpendicular to the optical axis. Therefore, the exciting conditions of the pre-deflection coil 8 are to compensate for the path of the electron beam by the amounts of $(X\_i,j - Xc\_i,j, Y\_i, j - Yc\_i,j)$ relative to each position on the sample surface. In addition, the pre-deflection coil 8 is required to control in synchronism with the electron beam position on the sample surface.

When the electron beam position on the front focal point 18 of magnetic sector 9 is thus controlled to be $(Xc\_i,j, Yc\_i,j)$ by use of the pre-deflection coil 8, the energy deviation Ec on the energy dispersion surface of magnetic sector 9 can be expressed by the following equation (4).

$$Ec\_i,j = p \times Xc\_i,j \tag{4}$$

Under this condition, the post-deflection coil 14 is controlled to make the energy deviation $(Ec\_i,j)$ of Equation (4) zero. Since the $Ec\_i,j$ is also the function of sample $(x\_i, y\_j)$ from Equations (1), (3) and (4), the post-deflection coil 14 is required to control in synchronism with the electron beam position on the sample surface.

Therefore, when the electron beam path is controlled by use of the exciting condition of the pre-deflection coil 8 and the post-deflection coin 14 in association with the electron beam position on the sample surface, the central controller 29 simultaneously transmits a control signal to the STEM controller 30 to control the electron beam position on the sample, a control signal to the electron-microscopic main body 20 to control the pre-deflection coil 8, and a control signal to the energy filter controller 28 to control the post-deflection coil 14.

Next, let it be described how to control the pre-deflection coil 8 and drift tube 16 as means for correcting the path of the electron beam.

The original function of the drift tube 16 is to shift the spectrum peculiar to elements being measured to a predetermined position on the electron beam detector 13. The initial setting conditions of the drift tube 16 are obtained by adjusting for the electron beam passing along the optical axis to be detected at a predetermined position on the electron beam detector 13. For small-magnification observation, the operation of the pre-deflection coil 8 is the same as in the case of using the post-deflection coil 14.

The energy deviation $(Ec\_i,j)$ on the energy dispersion surface can be expressed by the equation (4). To compensate for this deviation, the energy expressed by the equation (4) is directly converted into a voltage $(\Delta E = Ec\_i,j)$, and a voltage $(\Delta E)$ having a value equal to $Ec\_I,j$ but opposite to the sign is applied to the drift tube 16. Since the $Ec\_i,j$ is obviously the function of the sample $(x\_i, y\_j)$, the voltage $\Delta E$ to be applied to the drift tube 16 must be controlled in synchronism with the position of the electron beam on the sample surface. In other words, the central controller 29 simultaneously transmits a control signal to the STEM controller 30 to control the position of the electron beam on the sample, a control signal to the energy filter controller 28 to control the voltage to the drift tube 16, and a control signal to the electron-microscopic main body 20 to control the pre-deflection coil 8.

In addition, the small-magnification observation can be performed by controlling the exciting condition of the pre-deflection coil 8 and by controlling the exciting condition of the magnetic sector 9 used in the energy filter 11 in association with the position of the electron beam on the sample.

The magnetic sector 9 is primarily used to analyze the energy of the electron beam. In the small-magnification observation, the energy deviation $(Ec\_i,j)$ expressed by the equation (4) is converted to the exciting condition of the magnetic sector 9, and then controlled. Since the energy deviation $(Ec\_i,j)$ is of course the function of the electron beam position $(x\_i, y\_j)$ on the sample surface, the exciting condition to be applied to the magnetic sector is controlled in synchronism with the electron beam position on the sample surface. In other words, the central controller 29 simultaneously transmits a control signal to the STEM controller 30 to control the electron beam position on the sample, a control signal to the energy filter controller 28 to control the exciting condition of the magnetic sector, and a control signal to the electron-microscopic main body 20 to control the pre-deflection coil 8.

In this embodiment, the electron beam energy loss spectrum formed by the magnetic sector 9 is about 1 eV/$\mu$m when the turning-radius of the electron beam in the magnetic sector 9 is 100 mm. If this spectrum is magnified 100 times by the magnifying field lens 15, the energy dispersion of the electron beam energy loss spectrum becomes 0.01 eV/$\mu$m. If a multi-channel plate array of 25 $\mu$m/channel is used as the electron beam detector 13, 0.25 eV/channel can be obtained.

The operation of the devices within the control unit 21 at the time of spectrum measurement will be described below. When the operator enters the names of elements that he or she wants to observe through the input unit 31, the central controller 29 draws out the corresponding element information from the database 24, and supplies to the energy filter controller 28 the measurement conditions peculiar to each element included in the element information. The energy filter controller 28 controls the focus adjustment field lens 10, magnifying field lens 15, drift tube 16 and magnetic sector 9 according to the measurement conditions so that the electron beam having the energy range that includes the energies peculiar to the elements is incident to the electron beam detector 13.

The electron beam intensity signal on each channel of the electron beam detector 13 constitutes the electron beam energy loss spectrum. The electron beam intensity signals from the electron beam detector 13 are used in the operation part 23 for the background correction of the spectrum and the correction of the gain of the electron beam detector. The spectrum produced after the computation is stored in the memory 27, and displayed on the display unit 25. Thus, the operator can acquire the spectrum and an element distribution image after a sequence of those processes.

FIGS. 4A–4C are graphs showing the results of having measured the electron beam analyzed by the energy filter, and FIG. 4D shows the positions of the analyzed and measured electron beam. These graphs shown in FIGS. 4B and 4C are an example of electron beam energy loss spectra measured on the STEM of this embodiment when the electron beam is deflected to scan the sample up to a magnification corresponding to those positions that are 13 $\mu$m away from the optical axis 17. In this measurement, actually the sample is not placed, and the electron beam only passes through the object lens. The pre-deflection coil is composed of one stage of deflection coil.

FIG. 4A shows the results of measurement using the conventional electron microscope without correction for the path, and FIG. 4B shows the results of measurement with the path of the electron beam being corrected for by using only the pre-deflection coil 8. FIG. 4C are the results of measurement with the path of the electron beam being corrected for by using the pre-deflection coil 8 and post-deflection coil 14. In FIGS. 4A and 4B, the five spectra are shifted in the ordinate direction for clarity. In order to demonstrate the electron beam path correction effect, the electron beam on the sample is shifted, as shown in FIG. 4D, to a total of five positions that include A along the optical axis 7 as the reference position and its peripheral positions B, C, D and E as the observation range for verifying the correction effect.

According to the conventional electron microscope, since the electron beam on the sample is greatly shifted away from the optical axis 17, the electron beam passing through the project lens 7 is also greatly separated away from the optical axis 17. The result is that the electron beam cannot be incident to the energy filter 11. Thus, as shown in FIG. 4A, the electron beam detector 13 cannot detect the electron beams at the four peripheral positions of the observation range.

When the path of the electron beam is corrected for by using only the pre-deflection coil 8 of the electron microscope of this embodiment, the electron beam passing through the projection lens 7 can be incident to the energy filter 11 as shown in FIG. 43. From FIG. 4B, it will be understood that, since the intensities of the four spectra are substantially equal, the electron beam passing through the object lens 7 is incident to the energy filter 11 without obstruction. However, the peaks having the same energy appear at different energy values depending on the dissimilar positions on the sample.

In the electron microscope of this embodiment, the pre-deflection coil 8 deflects the electron beam so that it can be incident to the magnetic sector 9, and then the post-deflection coil 14 deflects the electron beam exiting from the magnetic sector 9 so that the path of the beam can be precisely corrected for particularly in the energy-axis direction. Thus, the results of measurement are as shown in FIG. 4C. As compared with the energy value obtained when the electron beam is irradiated along the optical axis 17, the results measured when the electron beam is deflected to reach the peripheral observation area on the sample can have a small energy shift of as low as a maximum value of 0.5 eV as will be understood from FIG. 4C.

Thus, by disposing not only the pre-deflection coil 8 on the upstream side of the magnetic sector 9 but also the post-deflection coil 14 on the downstream of the magnetic sector 9 and controlling those deflection coils, it is possible to measure the electron beam energy loss spectra with high precision. Shifting the electron beam by 3 micrometers away from the optical axis corresponds to the observation of spectra and images at 5000 magnifications.

Figure 5A:
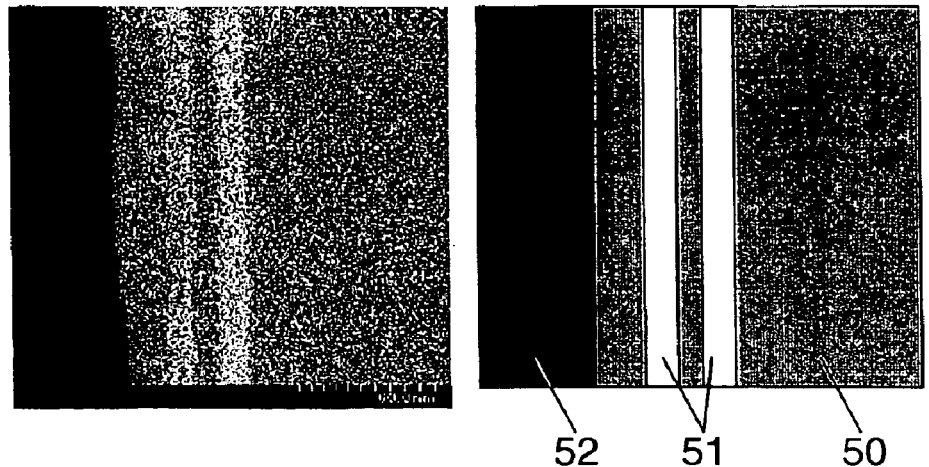
FIGS. 5A–5C show the results of observation of oxygen distribution according to the prior art and this embodiment of the invention.
Figure 5B:
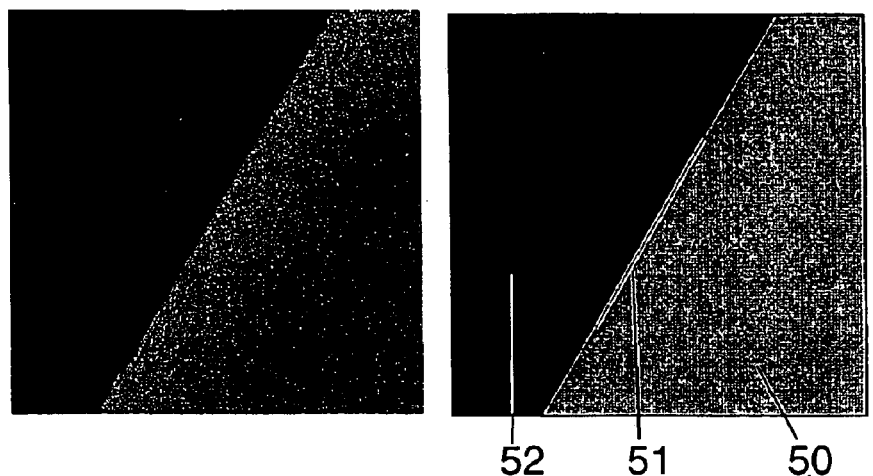
Figure 5C:
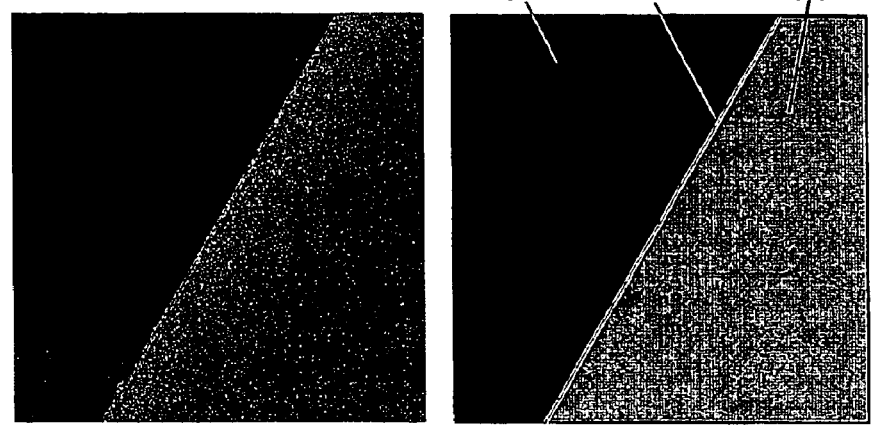
Figure 6:
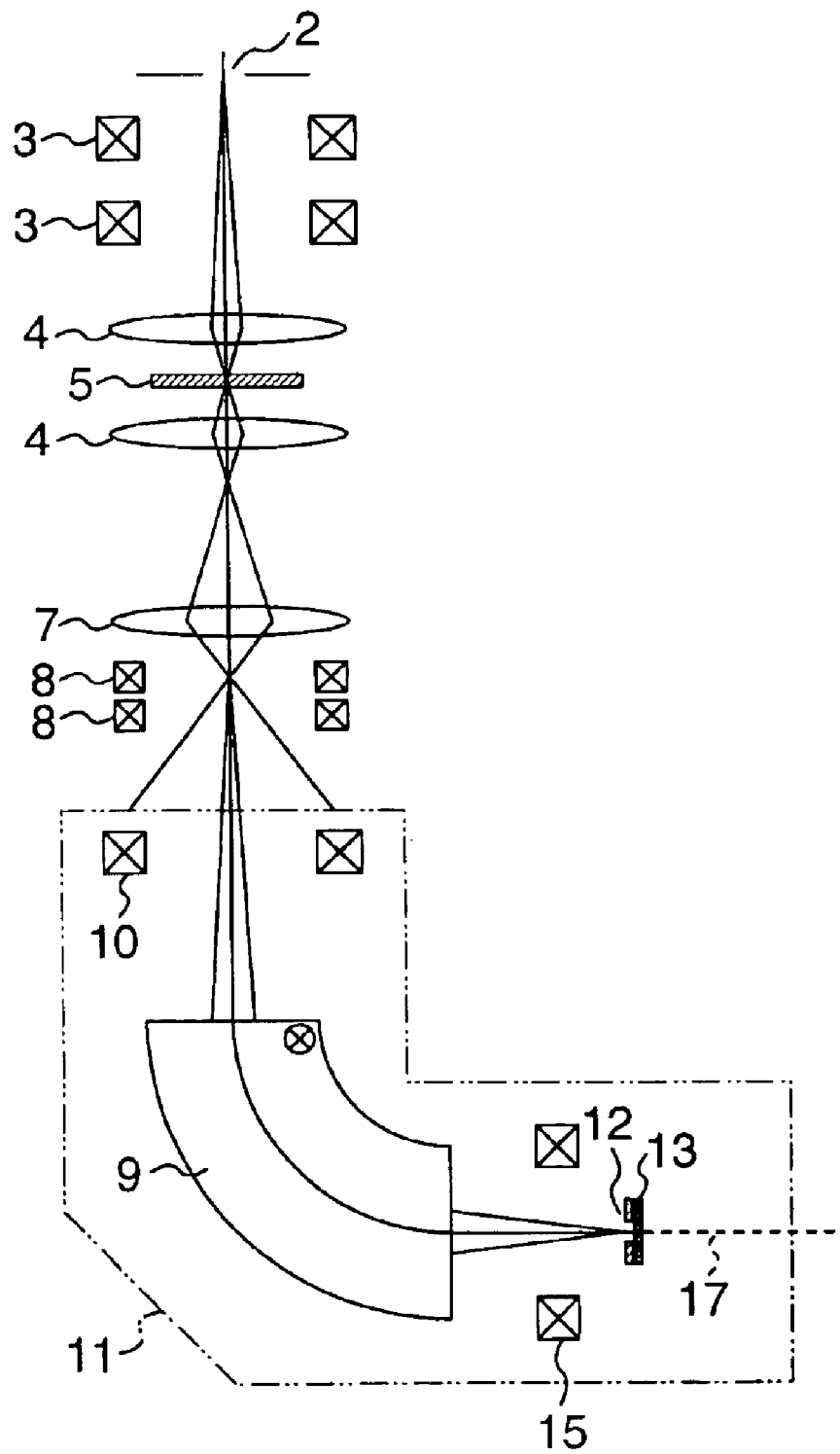
FIG. 6 is a schematic diagram of the construction of a conventional scanning transmission electron microscope having the energy filter.

FIGS. 5A–5C show examples of the observation of element distribution images of oxygen by use of the STEM of this embodiment. The sample observed is a lamination of two silicon oxide films each deposited 15 nm thick on a silicon substrate. The correction of the path of the electron beam on the sample is performed by the pre-deflection coil 8 disposed on the upstream side of the magnetic sector 9, and the electron beam exiting from the magnetic sector 9 is corrected for in the energy-axis direction of the electron beam energy loss spectrum by use of the drift tube 16. The value of the voltage applied to the drift tube 16 depends on the position of the electron beam on the sample. The voltage values determined by each position of the electron beam are stored in the memory 27.

FIG. 5A shows the result of observation of oxygen distribution at 0.5 million magnifications, FIG. 5B is the result of observation of oxygen at 5000 magnifications with the path not compensated for, and FIG. 5C is the result of observation with the path corrected for by the above means. From FIGS. 5B and 5C, it will be seen that the two silicon oxide films can be clearly observed at the centers of the images. However, the silicon oxide films cannot be observed in the peripheral areas of the images of FIG. 53, but they can be clearly observed in the peripheral areas of the images of FIG. 5C.

Thus, by the STEM of this embodiment it is possible to clearly observe element distribution images even at small magnification.

According to the invention of an electron microscope having an electron beam energy spectroscope, even if the electron beam on the sample is greatly deflected away from the optical axis of the microscope, electron beam energy spectra and element distribution images can be observed with high precision.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electron microscope having an energy filter for measuring electron beam energy loss spectra or observing element distribution states by analyzing the energy of an electron beam, wherein an electron beam energy loss spectrum of an electron beam irradiated on a sample surface at a position no more than 13 micrometers shifted away from the optical axis of said electron microscope has an energy deviation of 1 eV or below relative to that of said electron beam irradiated on said sample surface along the optical axis of said electron microscope.

2. An electron microscope having an energy filter that comprises:

energy dispersion means for analyzing the energy of an electron beam;

electron beam directing means provided on the upstream side of said energy dispersion means in order to for directing said electron beam to said energy dispersion means; and path correction means for correcting the path of said electron beam exiting from said energy dispersion means in the energy-axis direction of an energy dispersion plane formed by said energy dispersion means.

3. An electron microscope according to claim 2, wherein said electron beam directing means is composed of one or more stages of deflection coil.

4. An electron microscope according to claim 2, further comprising:

a slit for selecting said electron beam on the basis of its energy resulting from the analysis of said electron beam by said energy dispersion means; and deflection coils of at least one or more stages that constitute said electron beam directing means and said path correction means, said deflection coil disposed on the downstream side of said energy dispersion means being provided on the upstream side of said slit.

5. An electron microscope according to claim 2, wherein said electron beam directing means for directing said electron beam to said energy dispersion means is composed of at least one or more stages of deflection coil, and said path correction means is formed of a velocity regulator capable of accelerating or decelerating said electron beam.

6. An electron microscope according to claim 5, further comprising an electron beam path correction controller for controlling said velocity regulator.

7. An electron microscope according to claim 2, wherein said electron beam directing means is composed of at least one or more stages of deflection coil, and said path correction means is formed of an energy dispersion means by which a field intensity necessary for correcting the path of said electron beam is superimposed upon a field intensity for energy dispersion necessary for analyzing the energy of said electron beam.

8. An electron microscope according to claim 7, further comprising an electron beam path correction controller for controlling said energy dispersion means intensity adjuster.

9. An electron microscope according to claim 2, wherein said electron microscope is a scanning transmission electron microscope.

10. An electron microscope including an energy filter that has an energy dispersion means provided for analyzing the energy of an electron beam and deflection coils respectively disposed on the upstream and downstream sides of said energy dispersion means, wherein said deflection coil disposed on the upstream side of said energy dispersion means corrects the path of said electron beam in two directions of perpendicular axes in a plane normal to the optical axis of said energy dispersion means, or in a two-dimensional way, and said deflection coil disposed on the downstream side of said energy dispersion means corrects the path of said electron beam in a plane normal to said optical axis of said energy dispersion means so that at least one of the directions in which the path of said electron beam is corrected coincides with the energy axis of an energy dispersion plane formed by said energy dispersion means.

* * * * *